United States Patent
Lee et al.

(10) Patent No.: US 10,003,345 B2
(45) Date of Patent: Jun. 19, 2018

(54) CLOCK AND DATA RECOVERY CIRCUIT USING DIGITAL FREQUENCY DETECTION

(71) Applicant: Research & Business Foundation Sungkyunkwan University, Suwon-si (KR)

(72) Inventors: Kang Yoon Lee, Seoul (KR); Sang Yun Kim, Suwon-si (KR); In Seong Kim, Seoul (KR); Seong Jin Oh, Suwon-si (KR); Dong Soo Lee, Dangjin-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days. days.

(21) Appl. No.: 14/966,343

(22) Filed: Dec. 11, 2015

(65) Prior Publication Data

US 2016/0234007 A1 Aug. 11, 2016

(30) Foreign Application Priority Data

Dec. 11, 2014 (KR) .................. 10-2014-0178238
Jun. 16, 2015 (KR) .................. 10-2015-0085248

(51) Int. Cl.
*H03L 7/10* (2006.01)
*H03L 7/08* (2006.01)
(Continued)

(52) U.S. Cl.
CPC ............ *H03L 7/10* (2013.01); *H03L 7/0807* (2013.01); *H03L 7/23* (2013.01); *H03L 7/087* (2013.01);
(Continued)

(58) Field of Classification Search
CPC ..... H04L 7/033; H04L 7/0012; H03L 7/0891; H03L 7/089; H03L 7/18; H03L 7/0992
See application file for complete search history.

(56) References Cited

U.S. PATENT DOCUMENTS 6,034,570 A * 3/2000 Warwar ............... H03K 3/0231
327/280
6,288,583 B1 * 9/2001 Ozawa .................... H03L 7/187
327/113
(Continued)

FOREIGN PATENT DOCUMENTS

KR  10-2014-0096625 A  8/2014

*Primary Examiner* — Sophia Vlahos
(74) *Attorney, Agent, or Firm* — NSIP Law

(57) ABSTRACT

A clock and data recovery circuit is disclosed herein. The clock and data recovery circuit includes a phase detection unit, a charge pump, a loop filter, a voltage control oscillator, and a frequency detection unit. The voltage control oscillator has oscillation frequency that is variable in response to a frequency adjustment signal, and outputs an oscillation signal. The frequency detection unit includes a reference clock divider, a counter, and an oscillation frequency control unit. The reference clock divider generates a count-enable signal based on a reference clock signal. The counter generates an oscillation count signal by counting the pulses of the oscillation signal of the voltage control oscillator or the pulses of divided signals resulting from dividing the oscillation signal while the count-enable signal is being enabled. The oscillation frequency control unit compares a target count value with the value of the oscillation count signal, and outputs the frequency adjustment signal.

13 Claims, 4 Drawing Sheets

(51) Int. Cl.
  *H03L 7/23* (2006.01)
  *H03L 7/18* (2006.01)
  *H03L 7/089* (2006.01)
  *H03L 7/087* (2006.01)
  *H04L 7/033* (2006.01)
  *H04L 7/10* (2006.01)

(52) U.S. Cl.
  CPC ........... *H03L 7/089* (2013.01); *H03L 7/18* (2013.01); *H04L 7/033* (2013.01); *H04L 7/10* (2013.01)

(56) References Cited

U.S. PATENT DOCUMENTS

| | | | |
|---|---|---|---|
| 8,090,335 B1* | 1/2012 | Bataineh | H03L 7/089 327/156 |
| 8,098,788 B1* | 1/2012 | Oner | H03L 7/087 375/374 |
| 2001/0024962 A1* | 9/2001 | Bauer | H04H 60/12 455/556.1 |
| 2003/0048139 A1* | 3/2003 | Chien | H03L 7/099 331/11 |
| 2004/0008063 A1 | 1/2004 | Kim et al. | |
| 2004/0008087 A1 | 1/2004 | Hsu | |
| 2005/0237119 A1* | 10/2005 | Irie | H03L 7/113 331/16 |
| 2006/0226916 A1* | 10/2006 | Florescu | H03L 7/0898 331/16 |
| 2006/0258313 A1* | 11/2006 | Uozumi | H03L 1/02 455/252.1 |
| 2007/0112795 A1* | 5/2007 | Travison, Jr. | G06F 17/30327 |
| 2007/0153129 A1* | 7/2007 | Kawamoto | G06F 1/12 348/705 |
| 2007/0247248 A1* | 10/2007 | Kobayashi | H03D 13/004 331/167 |
| 2008/0042760 A1* | 2/2008 | Marutani | H03L 7/10 331/49 |
| 2008/0231378 A1* | 9/2008 | Cong | H03K 3/0315 331/57 |
| 2008/0284529 A1* | 11/2008 | Refeld | H03K 5/133 331/57 |
| 2011/0304367 A1* | 12/2011 | Oh | H03L 7/102 327/157 |
| 2014/0035684 A1* | 2/2014 | Na | H03L 5/00 331/15 |
| 2014/0253255 A1* | 9/2014 | Chan | H03L 7/099 331/36 C |
| 2015/0207514 A1* | 7/2015 | Kim | H03L 7/0992 455/73 |

\* cited by examiner

CLOCK AND DATA RECOVERY CIRCUIT USING DIGITAL FREQUENCY DETECTION

CROSS-REFERENCE TO RELATED APPLICATIONS

This application claims the benefit under 35 USC 119(a) and 365(b) of Korean Patent Application No. 10-2014-0178238, filed on Dec. 11, 2014 and Korean Patent Application No. 10-2015-0058248, filed on Jun. 16, 2015, in the Korean Intellectual Property Office.

BACKGROUND

1. Technical Field

The present invention relates generally to clock and data recovery technology, and more particularly to the frequency locking technology of clock and data recovery technology.

2. Description of the Related Art

In asynchronous communication, a transmitting device transmits data in the state where a receiving device is not synchronized with the transmitting device. Accordingly, the receiving device includes a clock and data recovery circuit configured to recover a clock from a received signal waveform and then identify data.

Before transmitting actual data, the transmitting device transmits a signal specially agreed in order to enable the receiving device to detect frequency and phase, i.e., a preamble signal. While receiving the preamble signal, the receiving device must detect frequency from the preamble signal first and then find the accurate phase of a clock signal having the detected frequency. The time it takes to perform the clock recovery procedure has become a cause of the degradation of performance as communication speed has become faster.

Clock and data recovery technology may be classified into a method using reference frequency and a method of following up the frequency of a received signal without requiring reference frequency. Clock and data recovery technology may be classified into an analog method and a digital method according to the way to reduce the difference between frequency and phase. The method using reference frequency is advantageous in that frequency detection time is short, a preamble is short and its structure is simple because a previously agreed frequency can be rapidly followed up, but is disadvantageous in that the method is vulnerable to a change in the frequency of a data signal and a reference frequency generation circuit is absolutely necessary. In contrast, the method using no reference frequency is advantageous in that the method is robust against a change in the frequency of a data signal and a reference frequency generation circuit is not required, but is disadvantageous in that frequency detection time is long, a preamble must be long and its structure is complicated.

SUMMARY

At least one embodiment of the present invention is directed to the provision of a clock and data recovery circuit using digital frequency detection.

At least one embodiment of the present invention is directed to the provision of a clock and data recovery circuit using digital frequency detection, which supports fast speed and which is simple.

At least one embodiment of the present invention is directed to the provision of a clock and data recovery circuit using digital frequency detection, which enables the setting of frequency to be changed from the outside.

According to an aspect of the present invention, there is provided a clock and data recovery circuit, including a phase detection unit, a charge pump, a loop filter, a voltage control oscillator, and a frequency detection unit, wherein the voltage control oscillator has oscillation frequency that is variable in response to a frequency adjustment signal, and outputs an oscillation signal; and wherein the frequency detection unit includes: a reference clock divider configured to generate a count-enable signal from a reference clock signal according to a reference division ratio; a counter configured to generate an oscillation count signal so that the oscillation count signal has a value that is obtained by counting the number of pulses of the oscillation signal of the voltage control oscillator or the number of pulses of divided signals resulting from dividing the oscillation signal while the count-enable signal is being enabled; and an oscillation frequency control unit configured to compare a target count value, determined based on the target frequency of the oscillation signal, with the value of the oscillation count signal, and to output the frequency adjustment signal.

The reference clock divider may be operative to generate the count-enable signal by frequency-dividing the reference clock signal according to the reference division ratio.

The oscillation frequency control unit may include: a comparison unit configured to compare the target count value, determined based on the target frequency of the oscillation signal, with the value of the oscillation count signal, and to output one of an up signal and a down signal; and a frequency adjustment signal determination unit configured to output an updated frequency adjustment signal obtained by increasing or decreasing the binary value of an immediately previous frequency adjustment signal in response to the up or down signal.

The reference clock divider, after an enabled interval of the count-enable signal has been terminated, may generate a first clock signal and provide the first clock signal to the comparison unit, and may generate a second clock signal obtained by delaying the first clock signal and provide the second clock signal to the frequency adjustment signal determination unit.

The frequency adjustment signal determination unit may be operative to update a bit value of the frequency adjustment signal according to a sequential search technique whenever the up or down signal is input, and to output an adjustment completion signal when all the bit values of the frequency adjustment signal have been determined.

The frequency adjustment signal determination unit may be operative to update a bit value of the frequency adjustment signal according to a binary search technique whenever the up or down signal is input, and to output an adjustment completion signal when all the bit values of the frequency adjustment signal have been determined.

The voltage control oscillator may be a ring-type oscillator in which a plurality of delay cells is connected and variable load resistors are provided in the respective delay cells; and the variable load resistors may be configured such that a plurality of load resistors, whose resistance values have been set according to a binary weighted method, is connected in parallel, and may be operative such that total load resistance is varied by connecting or disconnecting the load resistors based on respective bits of the frequency adjustment signal and frequency is adjusted by varying the delay time of each of the delay cells.

The clock and data recovery circuit may further include a target count storage unit configured to previously store target count values determined based on the target frequency of the oscillation signal, and to output a target count signal, corresponding to a target count value selected according to the reference division ratio, to the oscillation frequency control unit.

The clock and data recovery circuit may further include a multiplexer configured to provide any one of the target count signal, output from the target count storage unit, and an external reference count signal, provided from the outside, to the oscillation frequency control unit.

According to another aspect of the present invention, there is provided a method of adjusting the oscillation frequency of a clock and data recovery circuit including a phase detection unit, a charge pump, a loop filter, a voltage control oscillator, and a frequency detection unit, the method including: initializing, by the clock and data recovery circuit, a frequency adjustment signal adapted to adjust delay time that determines the frequency of an oscillation signal in the voltage control oscillator provided in the clock and data recovery circuit; outputting, by the voltage control oscillator, the oscillation signal; generating, by the clock and data recovery circuit, a count-enable signal from a reference clock signal according to a reference division ratio; generating, by the clock and data recovery circuit, an oscillation count signal so that the oscillation count signal has a value that is obtained by counting the number of pulses of the oscillation signal of the voltage control oscillator or the number of pulses of divided signals resulting from dividing the oscillation signal while the count-enable signal is being enabled; comparing, by the clock and data recovery circuit, a target count value, determined based on the target frequency of the oscillation signal, with the value of the oscillation count signal, and outputting, by the clock and data recovery circuit, the frequency adjustment signal; and adjusting, by the voltage control oscillator, delay time in response to the frequency adjustment signal.

Generating the count-enable signal may include generating the count-enable signal by frequency-dividing the reference clock signal according to the reference division ratio.

Outputting the frequency adjustment signal may include: comparing the target count value, determined based on the target frequency of the oscillation signal, with the value of the oscillation count signal, and outputting one of an up signal and a down signal; and outputting an updated frequency adjustment signal obtained by increasing or decreasing the binary value of an immediately previous frequency adjustment signal in response to the up or down signal.

Outputting the frequency adjustment signal may include updating a bit value of the frequency adjustment signal according to a sequential search technique whenever the up or down signal is input, and outputting an adjustment completion signal when all the bit values of the frequency adjustment signal have been determined.

Outputting the frequency adjustment signal may include updating a bit value of the frequency adjustment signal according to a binary search technique whenever the up or down signal is input, and outputting an adjustment completion signal when all the bit values of the frequency adjustment signal have been determined.

The voltage control oscillator may be a ring-type oscillator in which a plurality of delay cells is connected and variable load resistors are provided in the respective delay cells; and the variable load resistors may be configured such that a plurality of load resistors, whose resistance values have been set according to a binary weighted method, is connected in parallel, and may be operative such that total load resistance is varied by connecting or disconnecting the load resistors based on respective bits of the frequency adjustment signal and frequency is adjusted by varying the delay time of each of the delay cells.

The method further include outputting a target count signal corresponding to a target count value selected from target count values, determined based on the target frequency of the oscillation signal, according to the reference division ratio.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
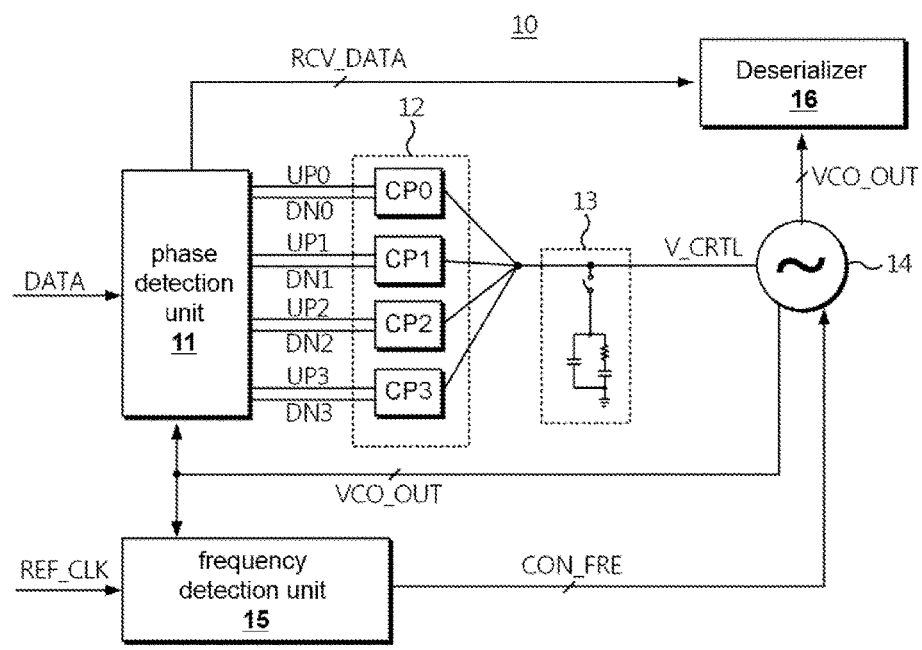
FIG. 1 is a block diagram illustrating a clock and data recovery circuit using digital frequency detection according to an embodiment of the present invention.

As to embodiments of the present invention disclosed herein, specific structural and functional descriptions are given merely for the purpose of illustrating the embodiments of the present invention. Embodiments of the present invention may be practiced in various forms, and the present invention should not be construed as being limited to the embodiments disclosed herein.

Embodiments of the present invention will be described in detail below with reference to the accompanying drawings. The same reference numerals are assigned to the same components throughout the accompanying diagrams, and redundant descriptions of the same components are omitted herein.

FIG. 1 is a block diagram illustrating a clock and data recovery circuit 10 using digital frequency detection according to an embodiment of the present invention.

Referring to FIG. 1, the clock and data recovery circuit 10 according to the present embodiment may include a phase detection unit 11, a charge pump 12, a loop filter 13, a voltage control oscillator 14, and a frequency detection unit 15.

The phase detection unit 11 may receive a data signal DATA, may generate recovered data RCV_DATA by sampling the data signal DATA by using the oscillation signal VCO_OUT of the voltage control oscillator 14 as a clock signal when the oscillation signal VCO_OUT is locked to desired frequency and phase, and may output the generated recovered data RCV_DATA to a deserializer 16.

During an interval in which the frequency of the oscillation signal VCO_OUT is still locked, the phase detection unit 11 does not operate substantially, or does not influence at least the frequency of the oscillation signal of the voltage control oscillator 14 even when it operates.

During an interval in which phase is locked after frequency has been locked, the phase detection unit 11 may compare a preamble, constituting the data signal DATA, with the phase of the oscillation signal VCO_OUT, and may output an up signal UP adapted to advance the phase of the oscillation signal VCO_OUT or a down signal DN adapted to delay the phase based on the results of the comparison.

In FIG. 1, the phase detection unit 11 may sequentially detect the phases of four successive preamble symbols for the purpose of application to a faster data signal DATA, and may generate sequentially and repeatedly four up signals UP0, UP1, UP2 and UP3 or four down signals DN0, DN1, DN2 and DN3.

The four up signals UP0, UP1, UP2 and UP3 or four down signals DN0, DN1, DN2 and DN3 are applied to four charge pump units CP0, CP1, CP2 and CP3 that constitute the charge pump 12.

The charge pump 12 provides current to the loop filter 13 based on the four up signals UP0, UP1, UP2 and UP3 or four down signals DN0, DN1, DN2 and DN3, thereby boosting or stepping down a control voltage V_CTRL that is to be applied to the voltage control oscillator 14.

Meanwhile, during an interval in which the frequency of the oscillation signal VCO_OUT is locked, the voltage control oscillator 14 is supplied with a reference voltage V_REF, other than the control voltage V_CTRL, from the voltage generation unit 141, oscillates based on the reference voltage V_REF and a frequency adjustment signal CON_FRE, and generates a control voltage oscillation signal VCO_OUT.

After the frequency of the oscillation signal VCO_OUT has been locked, the voltage control oscillator 14 may oscillate in response to the control voltage V_CTRL provided from the charge pump 12 via the loop filter 13, and may adjust the phase of the voltage oscillation signal VCO_OUT in accordance with the phase of the preamble symbols of the data signal DATA.

After the frequency and the phase have been locked, the voltage control oscillator 14 may supply the oscillation signal VCO_OUT to the phase detection unit 11 and the deserializer 16 as a clock. In particular, the voltage control oscillator 14 may supply four oscillation signals VCO_OUT, adjusted to have a phase difference of ¼, to the phase detection unit 11 and the deserializer 16, thereby recovering data from data having a frequency that is 4 times higher than that of the signal clock signal.

During such a data clock recovery procedure, a present invention-related detailed procedure is the procedure of locking the frequency of the oscillation signal VCO_OUT using the frequency detection unit 15.

The voltage control oscillator 14 is, for example, a ring-type differential oscillator in which a plurality of differential delay cells is connected. The frequency adjustment signal CON_FRE may adjust the oscillation frequency by varying the delay time of each of the differential delay cells by controlling a variable load resistor or a variable capacitor inside the differential delay cell. The voltage control oscillator 14 oscillates based on initialized delay time, set in response to an initialized frequency adjustment signal CON_FRE, and the reference voltage V_REF, and outputs the oscillation signal VCO_OUT.

In this case, the variable load resistors inside the differential delay cells are configured such that a plurality of load resistors, whose resistance values have been set according to a binary weighted method, is connected in parallel, and is operative such that total load resistance is varied by connecting or disconnecting the load resistors based on respective bits of the frequency adjustment signal and frequency is adjusted by varying delay time of the delay cells.

Figure 2:
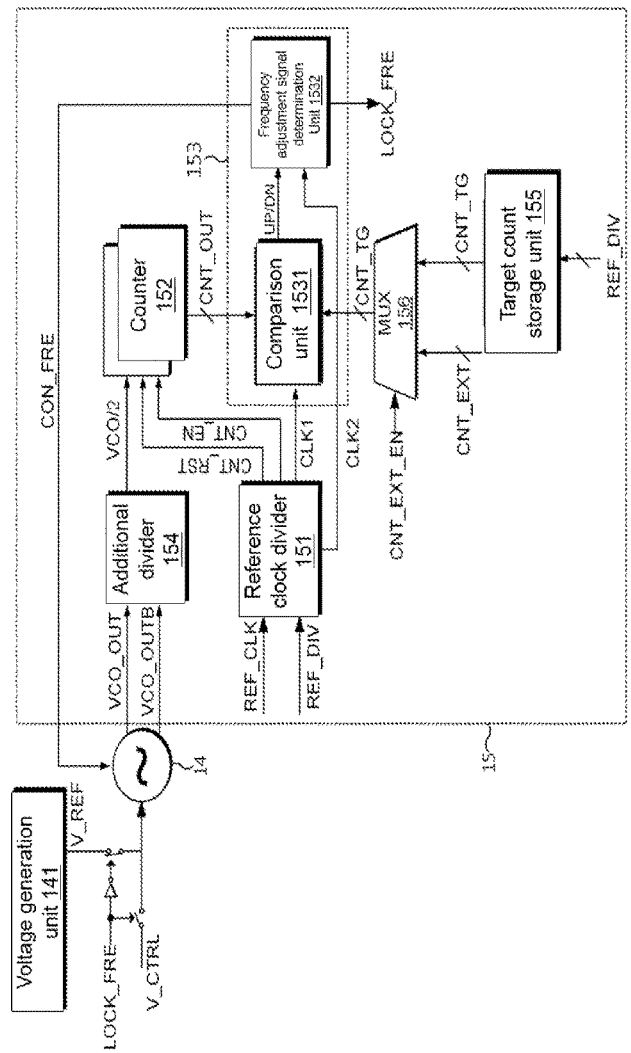
FIG. 2 is a block diagram illustrating, in detail, a frequency detection unit inside a clock and data recovery circuit using digital frequency detection according to an embodiment of the present invention.

Referring to FIG. 2, in order to describe the frequency detection unit 15 in detail, FIG. 2 is a block diagram illustrating, in detail, a frequency detection unit inside a clock and data recovery circuit 15 using digital frequency detection according to an embodiment of the present invention.

In FIG. 2, the frequency detection unit 15 may include a reference clock divider 151, a counter 152, and an oscillation frequency control unit 153. In an embodiment, the frequency detection unit 15 may further include an additional divider 154, a target count storage unit 155, and a multiplexer 156.

The reference clock divider 151 may generate a count-enable signal CNT_EN from a reference clock signal REF_CLK according to a reference division ratio signal REF_DIV.

More specifically, the reference clock divider 151 may generate the count-enable signal CNT_EN by frequency-dividing the reference clock signal REF_CLK according to the reference division ratio signal REF_DIV. For example, assuming that a 10 MHz reference clock signal REF_CLK is provided by a crystal oscillator, a 100 kHz clock signal obtained by frequency-dividing the reference clock signal REF_CLK by a reference division ratio of 1/100 becomes a pulse having an enabled interval of 5 μs. The reference clock divider 12 may generate the count-enable signal CNT_EN based on the pulse.

The counter 152 may generate the oscillation count signal CNT_OUT based on the oscillation signal comprising VCO_OUT and VCO_OUTB, in response to the count-enable signal CNT_EN. The character "B" in VCO_OUTB stands for "bar," which means "mathematical compliment," VCO_OUTB has a 180 degree opposite phase signal when compared to VCO_OUT.

It is assumed that a 312 MHz oscillation signal VCO_OUT oscillates in the differential ring-type voltage control oscillator 14. When the 312 MHz oscillation signal comprising VCO_OUT and VCO_OUTB has a frequency that is too high to be directly input to the counter 152, the signal may be additionally frequency-divided by an additional division ratio of ½ by an additional divider 154, and thus a 156 MHz additionally frequency-divided signal VCO/2 may be applied to the counter 152. When the enabled interval of the count-enable signal CNT_EN has a length of 5 μs, the counter 13 may count 780 pulses during the enabled interval. Accordingly, the counter 152 may be implemented as a 10-bit counter.

When the enabled interval of the count-enable signal CNT_EN has been terminated, the counter 152 terminates the count operation, and outputs an oscillation count signal CNT_OUT counted up to the time point.

The oscillation frequency controller 153 may compare a target count signal CNT_TG, determined based on the target frequency of the oscillation signal comprising VCO_OUT and VCO_OUTB, and the oscillation count signal CNT_OUT, and may output the frequency adjustment signal CON_FRE.

More specifically, the oscillation frequency control unit 153 may include: a comparison unit 1531 configured to compare a target count signal CNT_TG, determined based on the target frequency of the oscillation signal VCO_OUT, with the oscillation count signal CNT_OUT, and to output one of an up signal UP or a down signal DN; and a frequency adjustment signal determination unit 1532 configured to output an updated frequency adjustment signal CON_FRE, obtained by increasing or decreasing the binary value of an immediately previous frequency adjustment signal CON_FRE, in response to the up signal UP or down signal DN.

In particular, the frequency adjustment signal determination unit 1532 may update the bit values of the frequency adjustment signal CON_FRE according to a binary search technique whenever an up signal UP or down signal DN is input. In this case, the bit values of the frequency adjustment signal CON_FRE may be updated, for example, in such a manner that the bit values on respective digits may be determined by changing every two bits from an MSB based on an initial value in which only the MSB is 1 and the remaining bits are 0. All the bit values of the frequency adjustment signal CON_FRE correspond to a maximum of M times when the frequency adjustment signal CON_FRE has M bits.

In an embodiment, the frequency adjustment signal determination unit 1532 may update the bit values of the frequency adjustment signal CON_FRE according to a sequential search technique whenever an up signal UP or down signal DN is input. In this case, the bit values of the frequency adjustment signal CON_FRE may be updated, for example, in such a manner that the bit values on respective digits are determined by changing every 1 bit from an LSB based on an initial value in which all bits are 0. All the bit values of the frequency adjustment signal CON_FRE correspond to a maximum of $2^M$ times when the frequency adjustment signal CON_FRE has M bits.

Meanwhile, the frequency adjustment signal determination unit 1532 may output an adjustment completion signal LOCK_FRE when all the bit values of the frequency adjustment signal CON_FRE have been determined.

The oscillation frequency control unit 153 compares the target count signal CNT_TG with the oscillation count signal CNT_OUT whenever it receives the oscillation count signal CNT_OUT from the counter 152, and needs to update the frequency adjustment signal CON_FRE after the comparison has been terminated. In order to enable such operation timing to be accurately determined, after an enabled interval of the count-enable signal CNT_EN has been terminated, the reference clock divider 151 generates a first clock signal CLK1 and provides the first clock signal CLK1 to the comparison unit 1531, and generates a second clock signal CLK2 obtained by delaying the first clock signal CLK1 and provides the second clock signal CLK2 to the frequency adjustment signal determination unit 1532.

Since the target count storage unit 155 previously stores target count values determined based on the target frequency of the oscillation signal comprising VCO_OUT and VCO_OUTB, the target count storage unit 155 may select a target count value corresponding to the reference division ratio of the reference division ratio signal REF_DIV, and may output a target count signal CNT_TG corresponding to the target count value.

For example, when the target frequency is 312 MHz, the additional division ratio is 1/2, the reference clock signal REF_CLK is 10 MHz and the reference division ratio is 1/100, a target count signal CNT_TG having a target count value of 780 may be output.

When the oscillation frequency control unit 153 receives an oscillation count signal CNT_OUT having a count value of 600 from the counter 152, the comparison unit 1531 is to output an up signal UP, and the frequency adjustment signal determination unit 1532 is to update the bit values of the frequency adjustment signal CON_FRE toward an increase in the oscillation frequency by reducing the size of delay time.

Meanwhile, the multiplexer 156 may selectively provide any one of the target count signal CNT_TG output from the target count storage unit 155 and an external reference count signal CNT_EXT provided from the outside to the oscillation frequency control unit 153 in response to an external reference count-enable signal CNT_EXT_EN.

Figure 3:
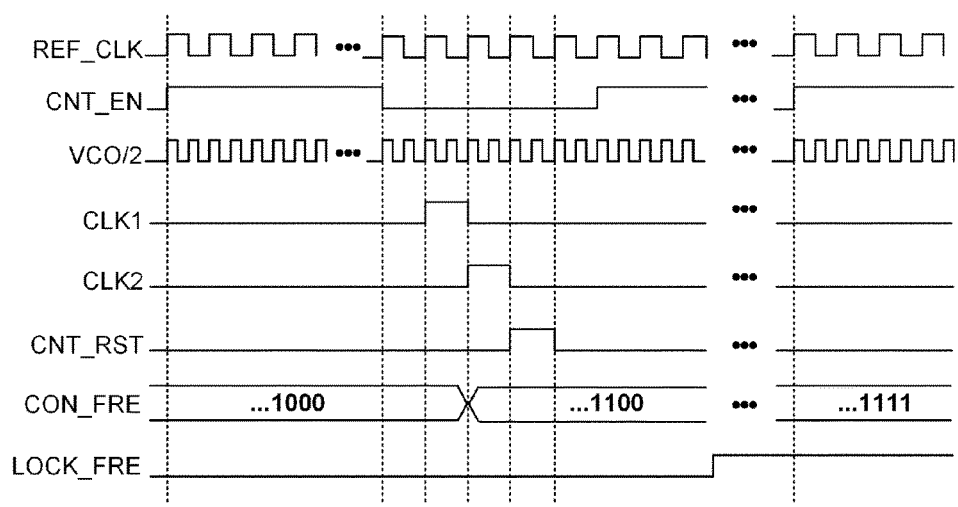
FIG. 3 is a timing diagram of control signals illustrating the operation of a clock and data recovery circuit using digital frequency detection according to an embodiment of the present invention.

Referring to FIG. 3 in order to describe the above operation in greater detail, FIG. 3 is a timing diagram of control signals illustrating the operation of a clock and data recovery circuit using digital frequency detection according to an embodiment of the present invention.

In FIG. 3, it may be seen that a count enabled interval signal CNT_EN having a relatively long enabled interval is generated by frequency-dividing the reference clock signal REF_CLK by the reference division ratio.

During the enabled interval of the count enabled interval signal CNT_EN, the counter 152 counts the pulses of an additionally divided signal VCO/2 frequency-divided by the additional divider 154.

After the enabled interval of the count enabled interval signal CNT_EN has been terminated, the operation of the comparison unit 1531 is enabled at a rising edge of the first clock CLK1, and the frequency adjustment signal CON_FRE is updated at a rising edge of the second clock CLK2 when the comparison unit 1531 outputs an up signal UP or down signal DN based on the results of the comparison.

After the second clock CLK2 has been enabled, the counter reset signal CNT_RST adapted to initialize the counter 152 may be enabled.

In this example, the first clock CLK1 may be viewed as a signal obtained by delaying the count-enable signal CNT_EN by one or two periods of the reference clock signal REF_CLK, and the second clock CLK2 may be a signal obtained by additionally delaying the first clock CLK1 by one or two periods of the reference clock signal REF_CLK. In the same manner, the counter reset signal CNT_RST may be viewed as a signal obtained by additionally delaying the second clock CLK2 by one or two periods of the reference clock signal REF_CLK.

This operation is repeated until the frequency adjustment signal CON_FRE cannot be updated any longer. Once all the bit values of the frequency adjustment signal CON_FRE have been determined, the adjustment completion signal LOCK_FRE is enabled.

Figure 4:
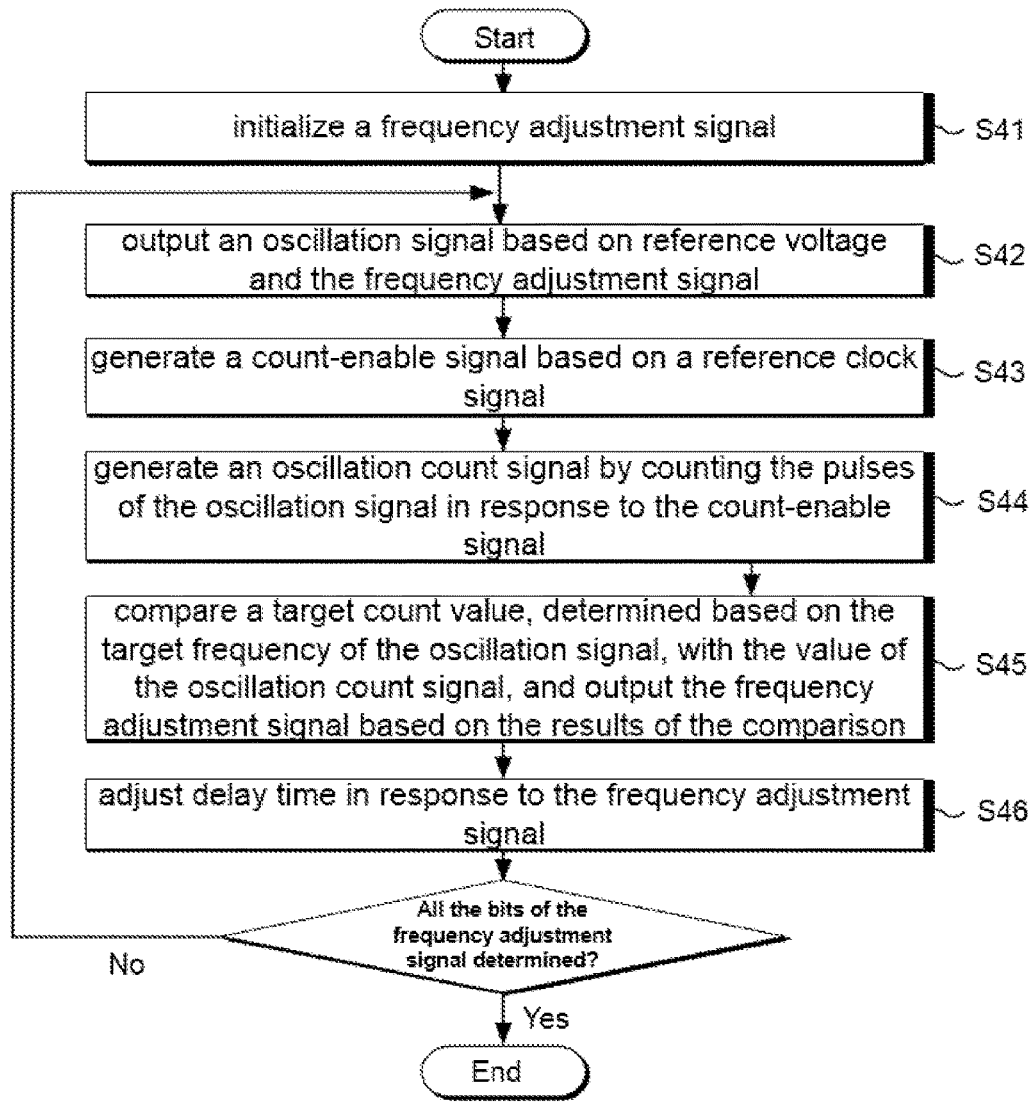
FIG. 4 is a flowchart illustrating a method of adjusting the frequency of a clock and data recovery circuit using digital frequency detection according to an embodiment of the present invention.

FIG. 4 is a flowchart illustrating a method of adjusting the frequency of a clock and data recovery circuit using digital frequency detection according to an embodiment of the present invention.

Referring to FIG. 4, the method of adjusting the oscillation frequency of a clock and data recovery circuit including a phase detection unit, a charge pump, a loop filter, a voltage control oscillator, and a frequency detection unit may start with step S41 of initializing, by the frequency detection unit 15, a frequency adjustment signal CON_FRE adapted to adjust delay time that determines the oscillation frequency VCO_OUT of the voltage control oscillator 14 provided in the clock and data recovery circuit 10.

In this case, the voltage control oscillator 14 is a ring-type oscillator in which a plurality of delay cells is connected and variable load resistors are provided in the respective delay cells. The variable load resistors may be configured such that a plurality of load resistors, whose resistance values have been set according to a binary weighted method, is connected in parallel, and may be operative such that total load resistance is varied by connecting or disconnecting the load resistors based on respective bits of the frequency adjustment signal and frequency is adjusted by varying delay time of each of the delay cells.

Thereafter, at step S42, the voltage control oscillator 14 may output an oscillation signal VCO_OUT based on a reference voltage V_REF and a frequency adjustment signal CON_FRE.

At step S43, the frequency detection unit 15 may generate a count-enable signal CNT_EN from a reference clock signal REF_CLK according to a reference division ratio REF_DIV.

In an embodiment, step S43 may include the step of generating a count-enable signal CNT_EN by frequency-dividing the reference clock signal REF_CLK according to a reference division ratio signal REF_DIV.

At step S44, the frequency detection unit 15 may generate an oscillation count signal CNT_OUT by counting the pulses of the oscillation signal VCO_OUT in response to the count-enable signal CNT_EN.

At step S45, the frequency detection unit 15 may compare a target count signal CNT_TG, determined based on the target frequency of the oscillation signal VCO_OUT, with the oscillation count signal CNT_OUT, and may output a frequency adjustment signal CON_FRE.

In an embodiment, step S45 may further include the step of outputting, by the frequency detection unit 15, a target count signal CNT_TG, corresponding to a target count value selected from target count values determined based on the target frequency of the oscillation signal VCO_OUT, according to the reference division ratio signal REF_DIV.

In an embodiment, step S45 may include: the step of comparing, by the frequency detection unit 15, a target count signal CNT_TG, determined based on the target frequency of the oscillation signal VCO_OUT, with the oscillation count signal CNT_OUT, and outputting, by the frequency detection unit 15, one of an up signal UP and a down signal DN; and the step of outputting, by the frequency detection unit 15, an updated frequency adjustment signal CON_FRE obtained by increasing or decreasing the binary value of an immediately previous frequency adjustment signal CON_FRE in response to the up signal UP or down signal DN.

Meanwhile, the step of outputting the frequency adjustment signal CON_FRE may include the step of updating a bit value of the frequency adjustment signal CON_FRE according to a sequential or binary search technique whenever the up signal UP or down signal DN is input, and outputting an adjustment completion signal LOCK_FRE when all the bit values of the frequency adjustment signal CON_FRE have been determined.

At step S46, the voltage control oscillator 14 may adjust delay time in response to the frequency adjustment signal CON_FRE.

Steps S42 to S46 may be repeated until a condition in which an adjustment completion signal LOCK_FRE is generated is satisfied. For example, in a binary search method, steps S42 to S46 may be repeated M times when the frequency adjustment signal CON_FRE has M bits.

A clock and data recovery circuit using digital frequency detection according to at least one embodiment of the present invention has the advantage of supporting fast speed and being simple.

A clock and data recovery circuit using digital frequency detection according to at least one embodiment of the present invention has the advantage of enabling the setting of frequency to be changed from the outside at any time.

The above embodiments and the accompanying drawings are intended merely to clearly illustrate part of the technical spirit of the present invention, and it will be apparent to those skilled in the art that modifications and specific embodiments that those skilled in the art can easily derive from the present specification and the accompanying drawings are all included in the range of the rights of the present invention.

Furthermore, the apparatus according to the present invention may be implemented in a computer-readable storage medium in the form of computer-readable code. The computer-readable storage medium includes all types of storage devices in which data that can be read by a computer system is stored. Examples of the storage medium includes read only memory (ROM), random access memory (RAM), an optical disk, magnetic tape, a floppy disk, a hard disk, nonvolatile memory, etc. Furthermore, the computer-readable storage medium may be distributed among computer systems connected over a network, and computer-readable code may be stored and executed in this computer-readable storage medium in a distributed manner.

What is claimed is:

1. A clock and data recovery circuit, comprising:
a voltage control oscillator having an oscillation frequency and configured to output an oscillation signal, wherein the oscillation frequency is variable, in response to a frequency adjustment signal; and
a frequency detector, comprising:
a reference clock divider configured to generate a count-enable signal from a reference clock signal according to a reference division ratio;
a counter configured to generate an oscillation count signal having a value obtained by counting a number of pulses of the oscillation signal or a number of pulses of a divided signal obtained by dividing the oscillation signal while the count-enable signal is being enabled;
an oscillation frequency controller configured to compare a target count value, among target count values, with a value of the oscillation count signal, and to output the frequency adjustment signal, wherein the target count value is determined based on a target frequency of the oscillation signal; and
a frequency adjustment signal determiner configured to output an adjustment completion signal, in response to all bit values of the frequency adjustment signal being determined;
a target count storer configured to store the target count values, and to output a target count signal to the oscillation frequency controller, wherein the stored target count values are determined based on the target frequency of the oscillation signal, and the target count signal corresponds to the target count value, which is selected according to the reference division ratio; and
a multiplexer configured to provide either one of the target count signal which is output from the target count storer and an external reference count signal provided to the oscillation frequency controller.

2. The clock and data recovery circuit of claim 1, wherein the reference clock divider is further configured to generate the count-enable signal by frequency-dividing the reference clock signal according to the reference division ratio.

3. The clock and data recovery circuit of claim 2,
wherein the oscillation frequency controller comprises a comparer configured to compare the target count value with the value of the oscillation count signal and to output either one of an up signal and a down signal, wherein the target count value is determined based on the target frequency of the oscillation signal, and wherein the frequency adjustment signal determiner is further configured to output an updated frequency adjustment signal obtained by increasing or decreasing a binary value of a previous frequency adjustment signal, in response to the up or down signal.

4. The clock and data recovery circuit of claim 3, wherein the reference clock divider is further configured to generate a first clock signal, to provide the first clock signal to the comparer, to generate a second clock signal obtained by delaying the first clock signal, and to provide the second clock signal to the frequency adjustment signal determiner, in response to an enabled interval of the count-enable signal being terminated.

5. The clock and data recovery circuit of claim 3, wherein the frequency adjustment signal determiner is further configured to update a bit value among the bit values according to a sequential search technique, in response to either one of the up signal and the down signal being input.

6. The clock and data recovery circuit of claim 3, wherein the frequency adjustment signal determiner further configured to update a bit value among the bit values according to a binary search technique, in response to either one of the up signal and the down signal being input.

7. The clock and data recovery circuit of claim 1,
wherein the voltage control oscillator is a ring-type oscillator comprising a plurality of delay cells, wherein variable load resistors are respectively disposed in the delay cells, and
wherein load resistors of the variable load resistors having a resistance set according to a binary weighted method are connected in parallel, and a total load resistance of the variable load resistors is varied by connecting or disconnecting the load resistors based on bits of the frequency adjustment signal, and the oscillation frequency is adjusted by varying a delay time of each of the delay cells.

8. A method of adjusting an oscillation frequency of a clock and data recovery circuit, the method comprising:
generating, by the clock and data recovery circuit, a count-enable signal from a clock signal by frequency dividing the reference clock signal according to a reference division ratio;
generating, by the clock and data recovery circuit, an oscillation count signal having a value obtained by counting a number of pulses of an oscillation signal of a voltage control oscillator or a number of pulses of a divided signal obtained by dividing the oscillation signal while the count-enable signal is being enabled;
comparing, by the clock and data recovery circuit, a target count value with a value of the oscillation count signal, wherein the target count value is determined based on a target frequency of the oscillation signal;
outputting, by the clock and data recovery circuit, a frequency adjustment signal, and outputting an adjustment completion signal, in response to all bit values of the frequency adjustment signal being determined;
adjusting, by the voltage control oscillator, a delay time, in response to the frequency adjustment signal;
outputting, by the clock and data recovery circuit, either one of an up signal and a down signal; and
outputting, by the clock and data recovery circuit, an updated frequency adjustment signal obtained by increasing or decreasing a binary value of a previous frequency adjustment signal, in response to either one of the up signal and the down signal.

9. The method of claim 8, further comprising updating a bit value among the bit values according to a sequential search technique, in response to either one of the up signal and the down signal being input.

10. The method of claim 8, further comprising updating a bit value among the bit values according to a binary search technique, in response to either one of the up signal and the down signal being input.

11. The method of claim 8,
wherein the voltage control oscillator is a ring-type oscillator comprising a plurality of delay cells, wherein variable load resistors are respectively disposed in the delay cells, and
wherein load resistors of the variable load resistors having a resistance set according to a binary weighted method are connected in parallel, and a total load resistance of the variable load resistors is varied by connecting or disconnecting the load resistors based on bits of the frequency adjustment signal, and the oscillation frequency is adjusted by varying the delay time of each of the delay cells.

12. The method of claim 8, further comprising outputting a target count signal corresponding to the target count value, which is selected from target count values according to the reference division ratio, wherein the target count signal is determined based on the target frequency of the oscillation signal.

13. A clock and data recovery circuit, comprising:
a voltage control oscillator having an oscillation frequency and configured to output an oscillation signal, wherein the oscillation frequency is variable, in response to a frequency adjustment signal; and
a frequency detector, comprising:
a reference clock divider configured to generate a count-enable signal from a reference clock signal according to a reference division ratio, to generate the count-enable signal by frequency-dividing the reference clock signal according to the reference division ratio;
a counter configured to generate an oscillation count signal having a value obtained by counting a number of pulses of the oscillation signal or a number of pulses of a divided signal obtained by dividing the oscillation signal while the count-enable signal is being enabled;
an oscillation frequency controller comprising a comparer configured to compare a target count value with a value of the oscillation count signal, to output the frequency adjustment signal, and to output either one of an up signal and a down signal, wherein the target count value is determined based on a target frequency of the oscillation signal; and
a frequency adjustment signal determiner configured to output an adjustment completion signal, in response to all bit values of the frequency adjustment signal being determined, and to output an updated frequency adjustment signal obtained by increasing or decreasing a binary value of a previous frequency adjustment signal, in response to either one of the up signal and the down signal,
wherein the reference clock divider is further configured to generate a first clock signal, to provide the first clock signal to the comparer, to generate a second clock signal obtained by delaying the first clock signal, and to provide the second clock signal to the frequency adjustment signal determiner, in response to an enabled interval of the count-enable signal being terminated.

* * * * *